United States Patent
Chuang et al.

(10) Patent No.: US 9,007,776 B2
(45) Date of Patent: Apr. 14, 2015

(54) ELECTRONIC MODULE

(71) Applicant: HTC Corporation, Taoyuan County (TW)

(72) Inventors: I-Cheng Chuang, Taoyuan County (TW); Chien-Hung Chen, Taoyuan County (TW); Chih-Hung Li, Taoyuan County (TW); Cheng-Te Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 56 days.

(21) Appl. No.: 13/714,424

(22) Filed: Dec. 14, 2012

(65) Prior Publication Data

US 2014/0168908 A1 Jun. 19, 2014

(51) Int. Cl.
| | |
|---|---|
| *H05K 7/00* | (2006.01) |
| *G06F 1/16* | (2006.01) |
| *H04M 1/00* | (2006.01) |
| *H05K 1/02* | (2006.01) |
| *H05K 1/14* | (2006.01) |
| *H04M 1/02* | (2006.01) |

(52) U.S. Cl.
CPC .......... *G06F 1/1658* (2013.01); *G06F 1/16* (2013.01); *H04M 1/00* (2013.01); *H05K 1/0218* (2013.01); *H05K 1/144* (2013.01); *H05K 2201/042* (2013.01); *H05K 2201/0723* (2013.01); *H05K 2201/1031* (2013.01); *H05K 2201/10371* (2013.01); *H05K 2201/2018* (2013.01); *H04M 1/0274* (2013.01)

(58) Field of Classification Search
CPC ....... H05K 1/145; H05K 1/144; H05K 3/368; H05K 9/0024; H05K 9/0026; H05K 9/0028; H05K 9/003; H05K 9/0032; H05K 9/0033; H05K 7/023; H05K 7/06; H05K 7/1422; H05K 2201/042; H05K 2201/10371; H05K 2201/10378; H05K 2201/10674; H05K 2201/2018; G06F 1/1658; G06F 1/16; H04M 1/00

USPC ......... 361/742, 790, 799, 800, 804, 816, 818, 361/735, 301.4; 174/377, 384–387

See application file for complete search history.

(56) References Cited

U.S. PATENT DOCUMENTS

| | | | | | |
|---|---|---|---|---|---|
| 4,692,843 | A | * | 9/1987 | Matsumoto et al. | 361/792 |
| 5,644,277 | A | * | 7/1997 | Gulick et al. | 333/246 |
| 7,679,196 | B2 | * | 3/2010 | Sekido et al. | 257/773 |
| 7,737,552 | B2 | * | 6/2010 | Beyne | 257/724 |
| 7,990,727 | B1 | * | 8/2011 | Mantz | 361/742 |
| 8,040,684 | B2 | * | 10/2011 | Wang et al. | 361/790 |
| 8,208,270 | B2 | * | 6/2012 | Mori et al. | 361/792 |
| 2005/0236171 | A1 | * | 10/2005 | Garcia | 174/35 GC |
| 2013/0083494 | A1 | * | 4/2013 | Syal et al. | 361/735 |

* cited by examiner

*Primary Examiner* — Lisa Lea Edmonds
*Assistant Examiner* — Christopher L Augustin
(74) *Attorney, Agent, or Firm* — Jianq Chyun IP Office

(57) ABSTRACT

An electronic module includes a first circuit board having a first surface, a second circuit board having a second surface, first electronic components on the first surface, second electronic components on the second surface, a first conductive fence, and a second conductive fence. The first conductive fence encloses the first electronic components and has a first opening exposing the first electronic components. The second conductive fence encloses the second electronic components and has a second opening exposing the second electronic components. The first opening of the first conductive fence joints the second opening of the second conductive fence, such that the first electronic components and the second electronic components are surrounded by the first circuit board, the second circuit board, the first conductive fence, and the second conductive fence. At least one of the first electronic components is higher than the first conductive fence.

7 Claims, 3 Drawing Sheets

ELECTRONIC MODULE

BACKGROUND OF THE INVENTION

1. Field of the Invention

The application relates to an electronic module. More particularly, the invention relates to a stacked-type electronic module.

2. Description of Related Art

With the advancement of science and technology, human beings tend to rely on electronic devices to a greater extent. To meet the requirement for light weight, slimness, compactness, and great operational performance, various handheld electronic devices, such as ultra mobile personal computers (UMPCs), tablet PCs, pocket PCs, personal digital assistants (PDAs), cell phones, and notebook PCs, have been developed.

However, due to the increasing demands for operational capabilities as well as other functions of the handheld electronic device, it is no longer sufficient to hold electronic components in the electronic device with an individual circuit board. Hence, a design of two stacked circuit boards has been applied to electronic modules in some electronic devices, so as to increase the number of the electronic components held by the circuit boards. FIG. 1 is a schematic cross-sectional view illustrating a conventional electronic module with a stacked structure. With reference to FIG. 1, the conventional electronic module 100 has two circuit boards 110 and 120. The circuit board 110 has a plurality of electronic components 112 thereon, and the circuit board 120 has a plurality of electronic components 122 thereon. Since the operational efficiency of the electronic components 112 and 122 continues to increase, electromagnetic waves that are generated during the operation of the electronic components 112 and 122 need to be properly shielded, so as not to affect antennas or other electronic components. Hence, the electronic component 112 is covered by a conductive fence 132 and a conductive cover 134, and the electronic component 122 is covered by a conductive fence 142 and a conductive cover 144. The circuit board 120, the electronic component 122 on the circuit board 120, the conductive fence 142 on the circuit board 120, and the overlying conductive cover 144 are then directly stacked onto the conductive cover 134.

To prevent the possible collision and the resultant damages to the electronic components 112 and 122, the conductive covers 134 and 144 are not allowed to be in contact with the electronic components 112 and 122. For instance, if the maximum height of each of the electronic components 112 and 122 is 1.2 mm, respectively, the height of each of the conductive fences 132 and 142 is required to reach at least 1.3 mm, respectively. A thickness of each of the conductive covers 134 and 144 is 0.1 mm, respectively, a thickness of each of the circuit boards 110 and 120 is 0.7 mm, respectively, and a thickness of an adhesive layer 150 between the circuit board 120 and the conductive cover 144 is 0.1 mm. Thereby, the overall thickness of the electronic module 100 reaches 4.3 mm. That is, the overall thickness of the electronic module 100 is determined by adding the thickness of the adhesive layer 150 to the total thickness of the individual circuit boards 110 and 120 and the overlying components. As a result, it is difficult for the electronic device having the electronic module 100 to satisfy the requirement for compactness and light weight.

SUMMARY OF THE INVENTION

The application provides an electronic module with a stacked-type design and small thickness.

In an embodiment of the invention, an electronic module that includes a first circuit board, a plurality of first electronic components, a first conductive fence, a second circuit board, a plurality of second electronic components, and a second conductive fence is provided. The first circuit board has a first surface. The first electronic components are located on the first surface of the first circuit board. The first conductive fence is located on the first surface of the first circuit board and encloses the first electronic components. Besides, the first conductive fence has a first opening that exposes the first electronic components. The second circuit board has a second surface. The second electronic components are located on the second surface of the second circuit board. The second conductive fence is located on the second surface of the second circuit board and encloses the second electronic components. Besides, the second conductive fence has a second opening that exposes the second electronic components. The first opening of the first conductive fence joints the second opening of the second conductive fence, such that the first electronic components and the second electronic components are surrounded by the first circuit board, the second circuit board, the first conductive fence, and the second conductive fence. At least one of the first electronic components is higher than the first conductive fence.

In view of the above, the two conductive fences in the electronic module described herein are directly jointed together, and the height of each electronic component is allowed to be greater than the height of each conductive fence. Accordingly, the overall thickness of the electronic module with the stacked structure may be reduced.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 2:
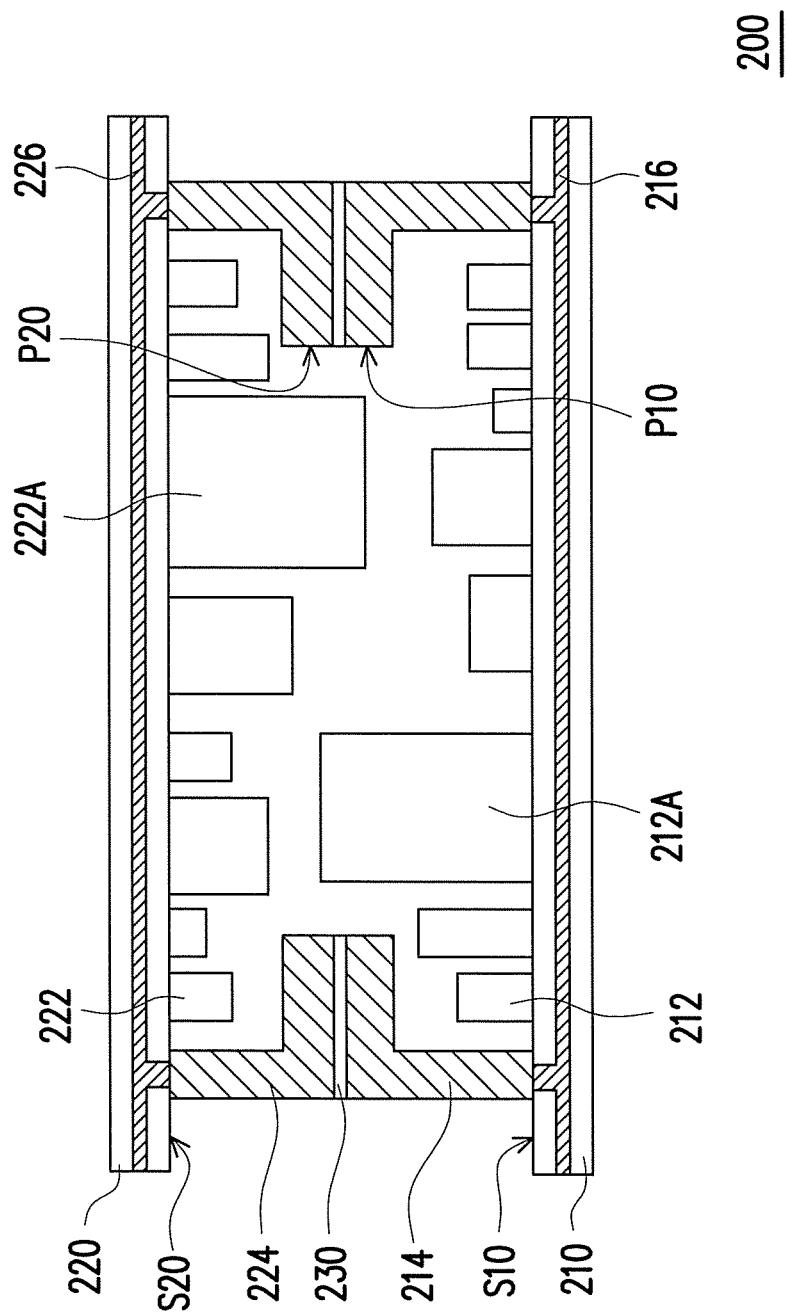
FIG. 2 is a schematic cross-sectional view illustrating an electronic module according to an embodiment of the invention.

FIG. 2 is a schematic cross-sectional view illustrating an electronic module according to an embodiment of the invention. With reference to FIG. 2, the electronic module 200 described in the present embodiment includes a first circuit board 210, a plurality of first electronic components 212, a first conductive fence 214, a second circuit board 220, a plurality of second electronic components 222, and a second conductive fence 224. According to the present embodiment, the electronic module 200 is applicable to electronic devices complying with the requirement for compactness and light weight, such as mobile phones, tablet PCs, and so forth.

The first circuit board 210 has a first surface S10. The first electronic components 212 are located on the first surface S10 of the first circuit board 210. The first conductive fence 214 is located on the first surface S10 of the first circuit board 210 and encloses the first electronic components 212. Certainly, other electronic components may be selectively placed on the first surface S10 of the first circuit board 210 outside of the first conductive fence 214. The first conductive fence 214 has a first opening P10 that exposes the first electronic components 212. The first opening P10 may merely expose some of the first electronic components 212, while some of the first electronic components 212 are covered by the first conductive fence 214.

The second circuit board 220 has a second surface S20. The second electronic components 222 are located on the second surface S20 of the second circuit board 220. The second conductive fence 224 is located on the second surface S20 of the second circuit board 220 and encloses the second electronic components 222. Certainly, other electronic components may be selectively placed on the second surface S20 of the second circuit board 220 outside of the second conductive fence 224. The second conductive fence 224 has a second opening P20 that exposes the second electronic components 222. The second opening P20 may merely expose some of the second electronic components 222, while some of the second electronic components 222 are covered by the second conductive fence 224.

The first opening P10 of the first conductive fence 214 joints the second opening P20 of the second conductive fence 224. That is, a portion of the first conductive fence 214 adjacent to the first opening P10 joints a portion of the second conductive fence 220 adjacent to the second opening P20, such that the first opening P10 and the second opening P20 face each other. Thereby, the first electronic components 212 and the second electronic components 222 are surrounded by the first circuit board 210, the second circuit board 220, the first conductive fence 214, and the second conductive fence 224. Namely, the first circuit board 210, the second circuit board 220, the first conductive fence 214, and the second conductive fence 224 together isolate the first electronic components 212 and the second electronic components 222 from the outside. This not only prevents the electromagnetic waves generated during the operation of the first and second electronic components 212 and 222 from escaping and affecting neighboring antennas or other surrounding electronic components but also precludes the external electromagnetic wave from affecting the operation of the first and second electronic components 212 and 222.

Figure 1:
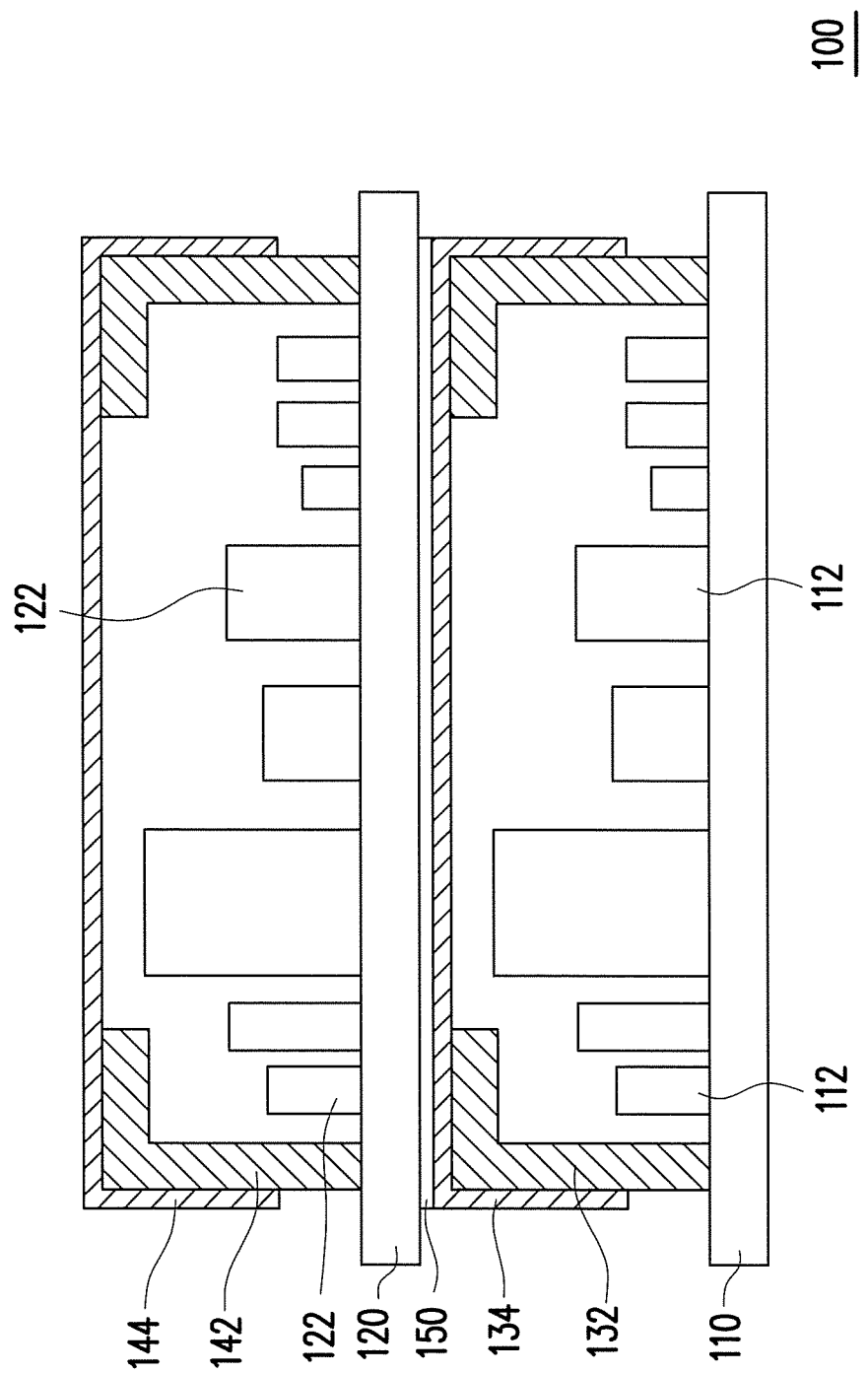
FIG. 1 is a schematic cross-sectional view illustrating a conventional electronic module with a stacked structure.

The first conductive fence 214 encloses but does not cover at least parts of the first electronic components 212, and the second conductive fence 224 encloses but does not cover at least parts of the second electronic components 222. Hence, some of the first electronic components (e.g., the first electronic component 212A) higher than the first conductive fence 214 may be contained within a range defined by the second conductive fence 224. Similarly, the second electronic component 222A higher than the second conductive fence 224 may also be contained within a range defined by the first conductive fence 214. Given that both the height of the first electronic component 212A and the height of the highest electronic component in the conventional electronic device shown in FIG. 1 are 1.2 mm, the height of the first conductive fence 214 and the height of the second conductive fence 224 may be 1 mm, respectively, which is shorter than 1.2 mm. In addition, the thickness of the first circuit board 210 and the thickness of the second circuit board 220 are both 0.7 mm. At this time, the total thickness of the electronic module 200 is 3.4 mm. Even though the thickness (0.1 mm) of the selectively-configured conductive gasket 230 is calculated as well, the total thickness of the electronic module 200 is 3.5 mm, which is far less than the thickness (4.3 mm) of the conventional electronic device depicted in FIG. 1. In light of the foregoing, the design of the electronic module 200 described herein not only allows the electronic module 200 to have the reduced total thickness but also helps the electronic device having the electronic module 200 comply with the requirement for compactness and light weight.

In the present embodiment, the first circuit board 210 has a ground layer 216, and the first conductive fence 214 is electrically connected to the ground layer 216, so as to direct electromagnetic waves to the ground through the ground layer 216. Likewise, the second circuit board 220 described in the present embodiment has a ground layer 226, and the second conductive fence 224 is electrically connected to the ground layer 226, so as to direct electromagnetic waves to the ground through the ground layer 226. The conductive gasket 230 is located on a contact surface of the first conductive fence 214 and the second conductive fence 224. Due to manufacture and assembly tolerance, the first conductive fence 214 and the second conductive fence 224 can barely be in complete contact with each other, such that the electromagnetic waves may penetrate the gap between the first conductive fence 214 and the second conductive fence 224. The gap between the first conductive fence 214 and the second conductive fence 224, however, may be filled with the conductive gasket 230. Here, the conductive gasket 230 may be made of conductive adhesive or any other appropriate material.

According to the present embodiment, each of the first conductive fence 214 and the second conductive fence 224 is an integrally-formed metal frame, respectively, i.e., there is no additional conductive cover on the first conductive fence 214 and the second conductive fence 224. Here, a shape of an orthogonal projection of the first conductive fence 214 on the first circuit board 210 and a shape of an orthogonal projection of the second conductive fence 224 on the second circuit board 220 are the same. Therefore, after the first conductive fence 214 joints the second conductive fence 224, the edge of the first conductive fence 214 just faces the edge of the second conductive fence 224. In the present embodiment, the height of the first conductive fence 214 is not limited to be the same as the height of the second conductive fence 224.

Another embodiment is given hereinafter for explanation. Note that reference numbers and some descriptions provided in the previous embodiment are also applied in the following embodiment. The same reference numbers represent the same or similar components in these embodiments, and repetitive descriptions are omitted hereinafter. The omitted descriptions may be referred to as those described in the previous embodiments.

Figure 3:
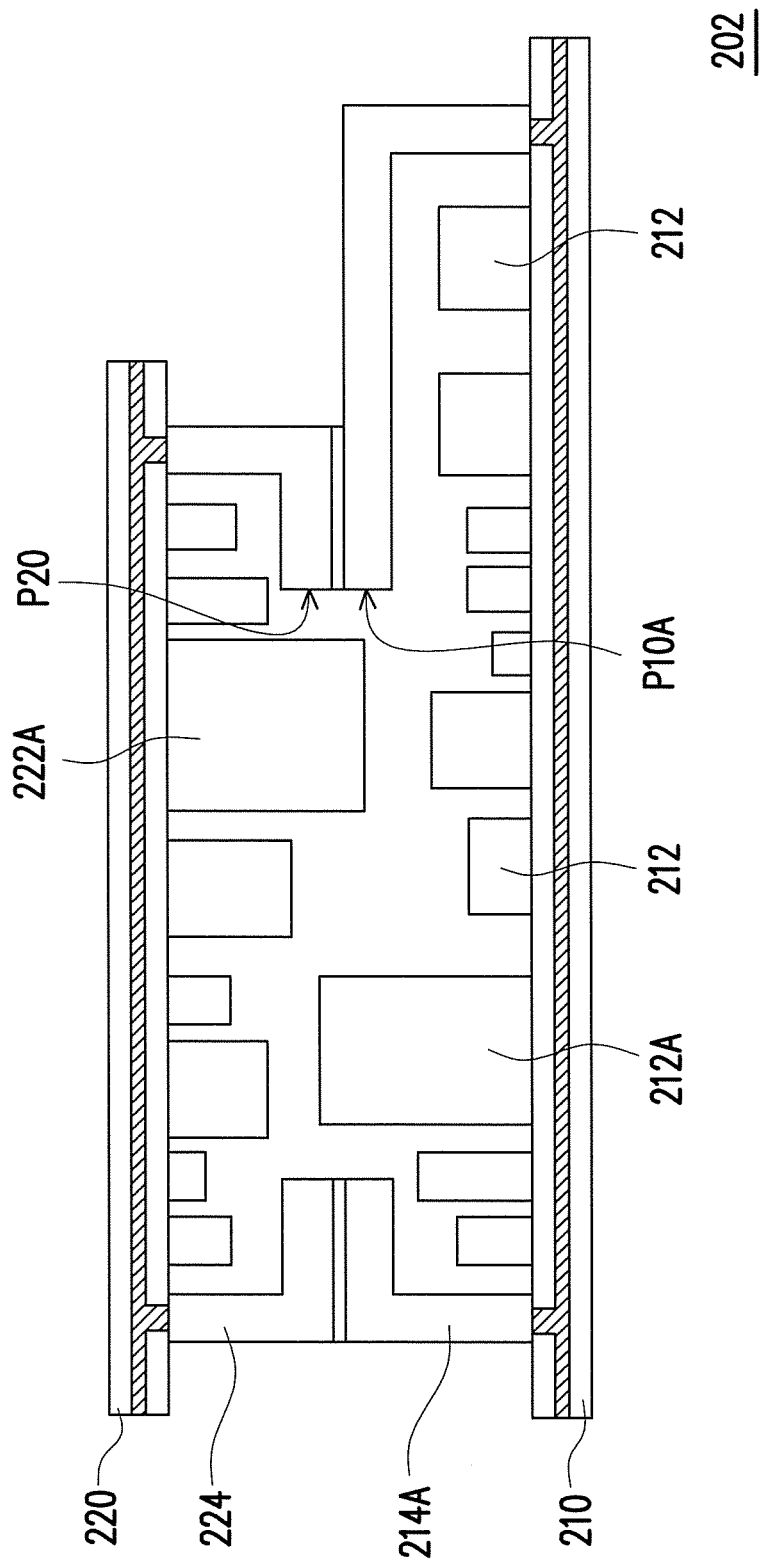
FIG. 3 is a schematic cross-sectional view illustrating an electronic module according to an embodiment of the invention.

FIG. 3 is a schematic cross-sectional view illustrating an electronic module according to an embodiment of the invention. With reference to FIG. 3, the difference between the electronic module 202 described herein and the electronic module 200 depicted in FIG. 2 lies in that the shape of the orthogonal projection of the first conductive fence 214A on the first circuit board 210 is different from the shape of the orthogonal projection of the second conductive fence 224 on the second circuit board 220. Nonetheless, the shape of the first opening P10A of the first conductive fence 214A is still the same as the shape of the second opening P20 of the second conductive fence 224. As such, the first electronic components 212 and the second electronic components 222 are still surrounded by the first circuit board 210, the second circuit board 220, the first conductive fence 214A, and the second conductive fence 224. Some of the first electronic components 212 located within the range defined by the first conductive fence 214A but outside the range defined by the second conductive fence 224 are covered by the first conductive fence 214A. Owing to the first and second openings P10A and P20, at least one of the first electronic components 212 (e.g., the first electronic component 212A) is higher than the first conductive fence 214A; alternatively, in an embodiment of the invention, at least one of the second electronic components 222 (e.g., the second electronic component 222A) may be higher than the second conductive fence 224. Hence, the electronic module 202 with the stacked-type design as described in the present embodiment also has the small overall thickness.

To sum up, in the electronic module described herein, individual electronic components may be higher than one of the conductive fences. As long as the one of the conductive fences joints the other conductive fence, the conductive fences may together enclose the electronic components to block electromagnetic waves. As a result, the overall thickness of the electronic module with the stacked-type design may be reduced.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An electronic module comprising:
a first circuit board having a first surface;
a plurality of first electronic components located on the first surface of the first circuit board;
a first conductive fence located on the first surface of the first circuit board, the first conductive fence enclosing the first electronic components and having a first opening exposing the first electronic components;
a second circuit board having a second surface;
a plurality of second electronic components located on the second surface of the second circuit board; and
a second conductive fence located on the second surface of the second circuit board, the second conductive fence enclosing the second electronic components and having a second opening exposing the second electronic components, the first opening of the first conductive fence jointing the second opening of the second conductive fence, such that the first electronic components and the second electronic components are surrounded by the first circuit board, the second circuit board, the first conductive fence, and the second conductive fence, wherein at least one of the first electronic components is higher than the first conductive fence, and each of the first conductive fence and the second conductive fence is an integrally-formed metal frame, respectively.

2. The electronic module as recited in claim 1, wherein a shape of an orthogonal projection of the first conductive fence on the first circuit board and a shape of an orthogonal projection of the second conductive fence on the second circuit board are the same.

3. The electronic module as recited in claim 1, wherein the first circuit board has a ground layer, and the first conductive fence is electrically connected to the ground layer.

4. The electronic module as recited in claim 1, wherein the second circuit board has a ground layer, and the second conductive fence is electrically connected to the ground layer.

5. The electronic module as recited in claim 1, further comprising a conductive gasket located on a contact surface of the first conductive fence and the second conductive fence.

6. The electronic module as recited in claim 1, wherein a material of the conductive gasket is conductive adhesive.

7. An electronic module comprising: a first circuit board having a first surface;
a plurality of first electronic components located on the first surface of the first circuit board;
a first conductive fence located on the first surface of the first circuit board, the first conductive fence enclosing the first electronic components and having a first opening exposing the first electronic components;
a second circuit board having a second surface;
a plurality of second electronic components located on the second surface of the second circuit board; and
a second conductive fence located on the second surface of the second circuit board, the second conductive fence enclosing the second electronic components and having a second opening exposing the second electronic components, the first opening of the first conductive fence jointing the second opening of the second conductive fence, such that the first electronic components and the second electronic components are surrounded by the first circuit board, the second circuit board, the first conductive fence, and the second conductive fence, wherein at least one of the first electronic components is taller than the first conductive fence, at least one of the second electronic components is taller than the second conductive fence, and the at least one of the first electronic components that is taller than the first conductive fence is overlapped with at least one of the second electronic component that is shorter than the second conductive fence, and the at least one of the second electronic components that is taller than the second conductive fence is overlapped with at least one of the first electronic components that is shorter than the first conductive fence; and each of the first conductive fence and the second conductive fence is an integrally-formed metal frame, respectively.

* * * * *